(12) United States Patent
Chiou

(10) Patent No.: US 8,171,800 B1
(45) Date of Patent: May 8, 2012

(54) DIFFERENTIAL PRESSURE SENSOR USING DUAL BACKSIDE ABSOLUTE PRESSURE SENSING

(75) Inventor: Jen-Huang Albert Chiou, Libertyville, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 13/013,237

(22) Filed: Jan. 25, 2011

(51) Int. Cl.
*G01L 13/02* (2006.01)
*G01L 9/06* (2006.01)

(52) U.S. Cl. ............... 73/736; 73/716; 73/721; 73/727

(58) Field of Classification Search ............ 73/700–756
See application file for complete search history.

(56) References Cited

U.S. PATENT DOCUMENTS

| | | | |
|---|---|---|---|
| 7,024,937 B2 * | 4/2006 | James | 73/756 |
| 7,073,375 B2 | 7/2006 | Parker et al. | |
| 7,077,008 B2 | 7/2006 | Pham et al. | |
| 7,429,786 B2 * | 9/2008 | Karnezos et al. | 257/686 |
| 7,475,597 B2 * | 1/2009 | Brida et al. | 73/715 |
| 2003/0150275 A1 * | 8/2003 | Wagner et al. | 73/715 |
| 2004/0016939 A1 * | 1/2004 | Akiba et al. | 257/126 |
| 2005/0229710 A1 * | 10/2005 | O'Dowd et al. | 73/718 |
| 2010/0300207 A1 | 12/2010 | Ding et al. | |

* cited by examiner

*Primary Examiner* — Andre Allen

(57) ABSTRACT

A MEMS differential pressure sensing element is provided by two separate silicon dies attached to opposite sides of a silicon or glass spacer, the sides of which are recessed and the recesses formed therein at least partially evacuated. The dies are attached to the spacer using silicon-to-silicon bonding provided in part by silicon oxide layers if a silicon spacer is used. The dies can be also attached to the spacer using anodic bonding if a glass spacer is used. Conductive vias extend through the layers and provide electrical connections between Wheatstone bridge circuits formed from piezoresistors in the silicon dies.

22 Claims, 10 Drawing Sheets

DIFFERENTIAL PRESSURE SENSOR USING DUAL BACKSIDE ABSOLUTE PRESSURE SENSING

BACKGROUND

Many silicon-based micro-sensors use so-called MEMS (microelectromechanical systems) technology to achieve low cost and high performance. One such a device is a MEMS pressure sensor, which is comprised of a small, thin silicon diaphragm onto which a piezoresistive circuit, normally a Wheatstone bridge, is formed. Diaphragm stresses caused by pressure applied to the diaphragm change the resistance values of the piezoresistors in the bridge circuit. An electronic circuit detects the resistance changes of the piezoresistive bridge and outputs an electrical signal representative of the applied pressure.

FIG. 1A is a cross-sectional view of a prior art differential pressure sensor 100, so named because it provides an output signal representative of the pressure difference between the top pressure and the bottom pressure on the diaphragm 122 of FIG. 1B of the differential pressure sensing element 102 shown in FIG. 1B. FIG. 1B is a cross-sectional diagram of a differential pressure sensing element 102 mounted inside the housing depicted in FIG. 1A.

In FIG. 1A, the pressure sensor 100 is comprised of a housing 104 that encloses a MEMS pressure sensing element 102 and an application-specific integrated circuit (ASIC) 106. One fluid pressure from liquids or gases is applied to the bottom of the diaphragm of the MEMS pressure sensing element through a pressure port 108 formed into the housing 104. The other fluid pressure from gases through the cover 107 is applied to the top of the gel 124 which passes the pressure to the top of the diaphragm of the MEMS pressure sensing element (or silicon die) 102. The MEMS pressure sensing element 102 is electrically connected to ASIC 106 by conductive wires 103, well-known in the prior art and which provide electrical connections between the ASIC 106 and the pressure sensing element 102. Conductive wires also connect the ASIC 106 to the leadframes 105 for the input and output voltages.

As stated above, FIG. 1B is a cross-sectional diagram of a prior art MEMS pressure sensing element 102. The MEMS pressure sensing element 102 is a differential pressure sensing element comprised of a thin silicon die 110. The die 110 is formed from silicon. A piezoresistive Wheatstone bridge circuit 112 is formed in the die 110 and located near the edge of a thin diaphragm region 114.

The die 110 sits atop a pedestal 116, which is in turn attached to the housing 104 by an adhesive 120. Fluid that flows in the port 108 applies pressure to the bottom of diaphragm 122 formed by the placement of the die 110 over the port 108. The other fluid flows to the top of gel 124 and pressurizes the top of diaphragm 122. Arrows 123 represent pressure applied to the top and bottom of the diaphragm. A differential pressure or a difference between the pressure 123 applied downwardly and the pressure 123 applied upwardly causes the diaphragm 122 to deflect. The deflection caused by the pressure difference causes the piezoresistors in the bridge circuit 112 to change their physical dimensions which in turn changes their resistive values. The MEMS pressure sensing element 102 shown in FIG. 1B can be seen in FIG. 1A embedded in a conventional gel 124, an intended function of which is to protect the sensing element 102.

DETAILED DESCRIPTION

The gel 124 used in MEMS sensors tends to be bulky and massive. It can therefore adversely affect a MEMS pressure sensor responsiveness device during vibration.

Electrical charges in a gel 124 can also tend to distort the electrical properties of the piezoresistors from which the Wheatstone bridge circuits are formed. A differential pressure sensor that can eliminate the need for gel would be an improvement over the prior art.

Figure 1A:
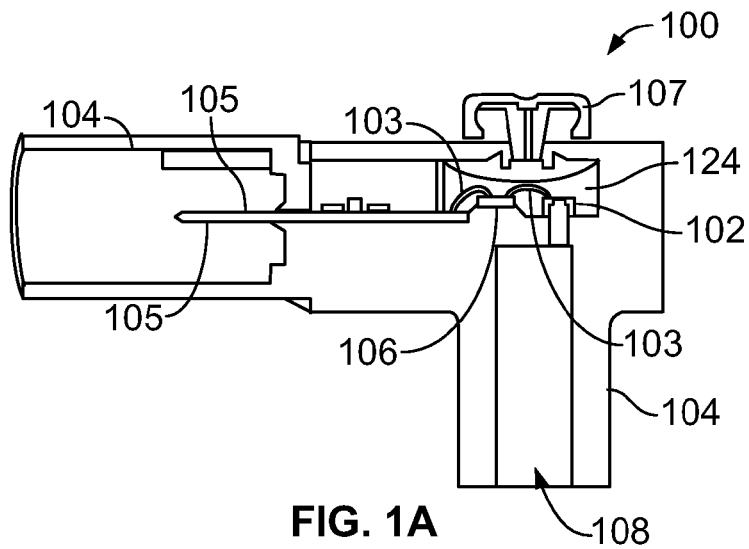
FIG. 1A is a cross-sectional view of a prior art differential pressure sensor.
Figure 1B:
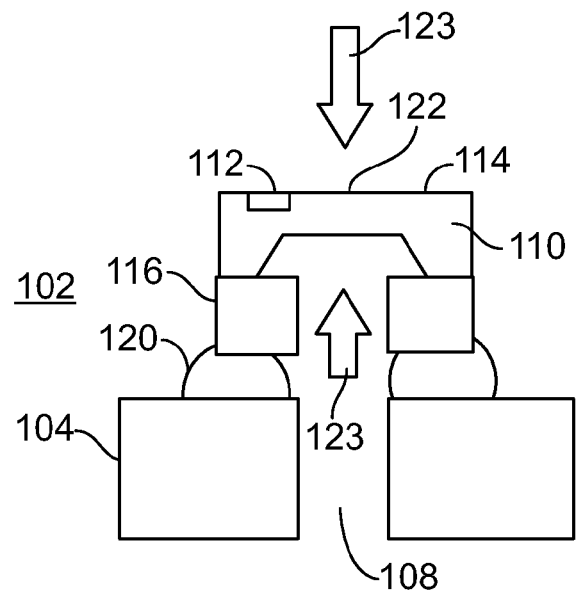
FIG. 1B is a cross-sectional view of a prior art microelectromechanical systems sensing element used in the pressure sensor shown in FIG. 1A.
Figure 2:
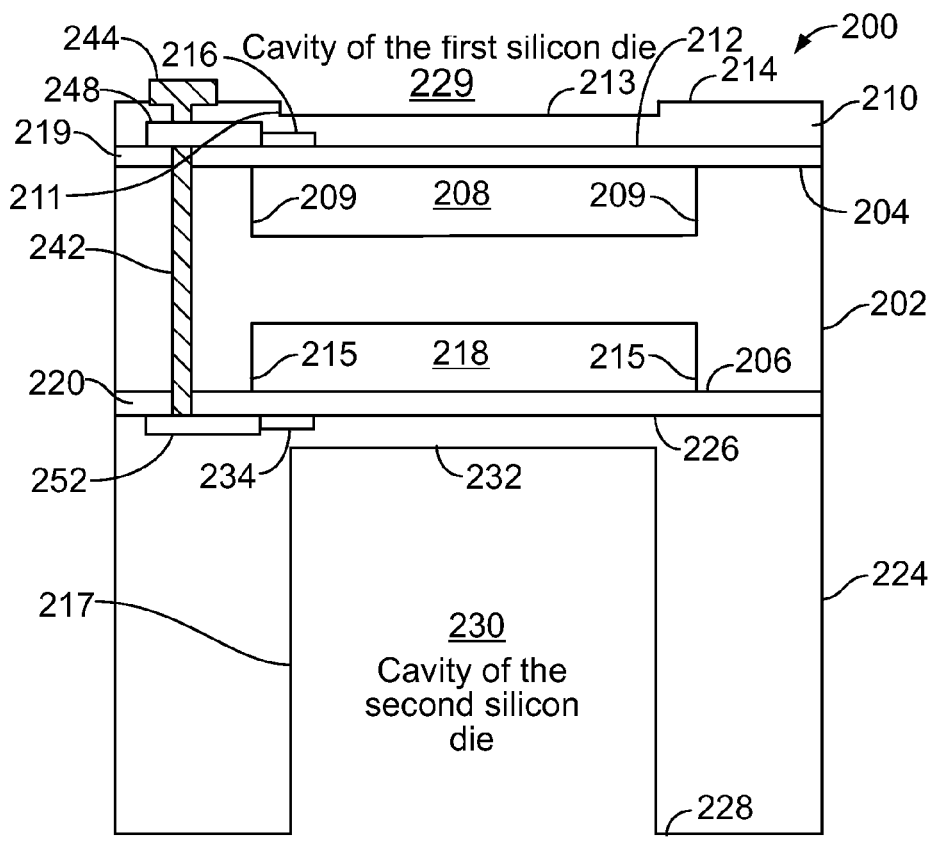
FIG. 2 is a cross-section of the pressure sensor shown in FIG. 1.

FIG. 2 is a cross-sectional diagram of a pressure sensing element 200 preferred embodiment. The pressure sensing element 200 is comprised of a spacer 202 having a top side 204 and a bottom side 206. The top and bottom sides are both formed to have recesses 208 and 218 included in them. The spacer 202 is made of crystal silicon and silicon-to-silicon-bonded with the first and second silicon dies. The spacer 202 can be also made of borosilicate glass and anodically bonded with the first and second silicon dies.

The top side 204 of the spacer 202 is overlaid with a first silicon die 210 having a thickness between about 10 and about 100 microns. A first side 212 of the die 210 faces the top side 204 of the spacer 202. An oxide layer 219 is formed on the first side 212 of the first die 210. An opposite second side 214 of the die 210 is formed to have a cavity 229. The die 210 covers the recess 208 in the top side 204 of the spacer 202, which is at least partially evacuated, and thereby acts as a diaphragm for the backside absolute pressure sensing, which deflects upwardly or downwardly responsive to pressure applied to the second side of the die 210.

A first piezoresistive Wheatstone bridge circuit 216 is formed in the first side 212 of the die 210 near the side wall 211 of the cavity 229 of the first silicon die 210. The wall size of the cavity 229 is smaller than the size of wall 209 of the recess 208. The first Wheatstone bridge circuit 216 is therefore located near the edge 211 of the diaphragm 213 formed by the first silicon die 210. The first silicon die 210 is attached to the top side 204 of the spacer 202 by silicon-to-silicon bonding provided by a silicon oxide layer 219.

A second silicon die 224 is attached to the bottom side 206 of the spacer 202 by a second oxide layer 220. The second silicon die 224 is thicker than the first silicon die 210. The second silicon die 224 has a top or first side 226 and a bottom or second side 228. The first side 226 faces the bottom 206 of the spacer 202. An oxide layer 220 is formed on the first side 226 of the second die 224. The second side 228 of the second silicon die 224 is processed to have a pressure cavity 230 that extends upwardly from the bottom 228 of the second die 224. The cavity 230 stops near the first side 226 of the second die 224 to define a thin membrane or diaphragm 232. The thickness of the diaphragm 232 in the second die 226 is similar to the thickness of the first silicon die 210.

A second Wheatstone bridge circuit 234 is formed in the first side 226 of the second silicon die 224. The second die 224 covers a recess 218 in the bottom 206 of the spacer 202. As with the recess 208 in the top 204 of the spacer 202, the recess 218 in the bottom 206 of the spacer 202 is at least partially evacuated. The diaphragm 232 of the second die 224 for the other backside absolute pressure sensing deflects upwardly or downwardly responsive to pressure applied to the second die 224.

As with the first Wheatstone bridge circuit 216, the second Wheatstone bridge circuit 234 is formed near the sidewall 217 of the cavity 230. The wall size of the cavity 230 is smaller than the size of wall 215 of the recess 218 formed into the bottom 206 of the spacer 202. The second Wheatstone bridge 234 is therefore near the edge 217 of the diaphragm 232 comprised of the second die 224.

The two Wheatstone bridge circuits 216 and 234 are formed from piezoresistors deposited into the dies. The values of the resistors change in response to fluctuation of the silicon dies. When a voltage is input to the Wheatstone bridge circuits, their output voltages change in response to deflection of the dies or the differential pressure on the dies. Electrical connections to the Wheatstone bridge circuits' inputs and outputs are provided by conductive layers formed into the respective dies.

Figure 3:
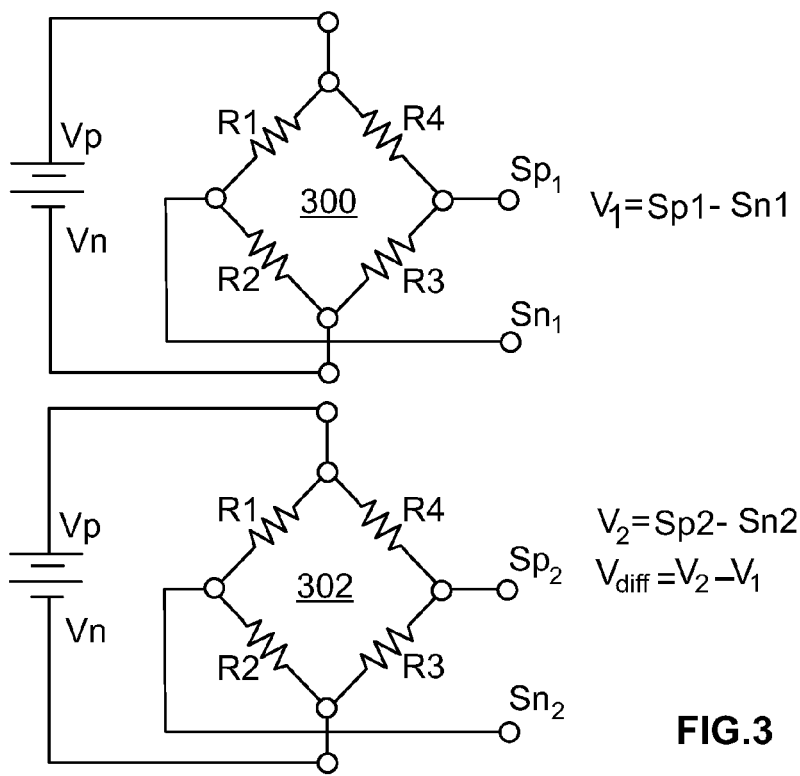
FIG. 3 shows how two Wheatstone bridge circuits are connected in a first embodiment.

FIG. 3 shows two Wheatstone bridge circuits 300 and 302 formed using four "R"-valued piezoresistors or so called P– resistors formed into the silicon dies using processes known in the prior art. Resistors R1 and R2 are connected in series to each other. Resistors R3 and R4 are connected in series to each other. The series-connected R1 and R2 are connected in parallel to the series-connected R3 and R4.

The Wheatstone bridge circuits 300 and 302 have two input nodes denominated as $V_p$ and $V_n$ and two output nodes denominated as $S_p$ and $S_n$. $V_p$ is usually a small positive voltage, typically about three volts. $V_n$ is usually ground or zero volts but $V_n$ could also be a negative voltage. The nodes between the R-valued piezoresistors are provided with electrical interconnects 248 or 252 formed by P+ conductive silicon interconnects that are deposited onto the first side 212 of the first silicon die 210. The node between R1 and R4 is considered to be the first input node $V_p$; the node between R2 and R3 is considered to be the second input node V. The node between R3 and R4 is the first output node $S_p$. The node between R1 and R2 is the second output node $S_n$.

FIG. 3 shows how the two Wheatstone bridge circuits 300 and 302 are connected in a first embodiment of a pressure sensing element 200. As shown in FIG. 3, the two Wheatstone bridge circuits are independent from each other. A direct current voltage is connected to $V_p$ and $V_n$. The output voltage is taken from $S_p$ and $S_n$. The voltage difference between the voltages at $S_p$ and $S_n$ is the output voltage.

When a voltage is input to the input terminals $V_p$ and $V_n$, the output voltage at the output terminals $S_p$ and $S_n$ changes in response to changes in the values of the piezoresistors. Since the piezoresistors are formed into the diaphragms 213 and 232 of the thin silicon dies 210 and 224, the nominal resistance of R ohms will change when the diaphragms deflect in response to pressures applied to the diaphragms. In a first embodiment of the pressure sensing element 200, the voltage difference Vdiff between the output voltage V1 (V1=Sp1– Sn1) from the first bridge circuit 300 and the output voltage V2 (V2=Sp2–Sn2) from the second bridge circuit 302 represents a pressure difference, i.e., the difference in pressure applied to the top silicon die 210 and the pressure applied to the second silicon die 224.

Electrical connections to the P– resistors that form the first Wheatstone bridge circuit 216 are provided by P+ conductive silicon interconnects 248 formed into the first side 212 of the die 210. The P+ conductive silicon interconnects 248 extend from the R-valued piezoresistors over to conductive vias 242 located near the edge of the die 210 and which extend through the die 210 from the first side 212 to its second side 214. The vias 242 that extend through the die 210 terminate at conductive bond pads 244 on the second side 214 of the die 210.

As described more fully below with regard to FIG. 7, wires are connected to the bond pads 244 that extend to an ASIC, best seen in FIG. 7.

Electrical connections of the P– piezoresistors of the second Wheatstone bridge circuit 234 of the second silicon die 224 are also provided by way of P+ conductive silicon interconnect 252 formed on the top side 226 of the second silicon die 224. As with the first die 210, P+ conductive silicon interconnects 252 extend from the R-valued piezoresistors of the second Wheatstone bridge circuit 234 over to conductive vias 242 located near the edge of the second die 224 but which extend downwardly through the second oxide layer 220, from the spacer 202. The vias 242 thus extend from the second set of P+ interconnects 252 on the first side 226 of the second die 224, upwardly through the second oxide layer 220, through the spacer 202, through the first oxide layer 219, through the first silicon die 210 to the aforementioned bond pads 244 on the second side 214 of the first die 210.

Since FIG. 2 is a cross-section of the pressure sensing element 200, only one conductive via 242 is shown in the figure. Additional vias 242 not visible in FIG. 2 exist in the spacer 202, the oxide layers 219 and 220, the first die 210 and the second die 224, which are in front of and behind the via 242 that is visible in FIG. 2. The vias 242, which are comprised of a conductive material formed into holes through the various layers, simply act as vertically-oriented conductors of electrical signals through the various layers of the pressure sensing element 200.

The conductive vias 242 are formed by etching holes in the spacer 202, the first silicon die 210 and the second silicon die 224 at locations on each component, which are coincident with each other when the spacer 202, oxide layers 219 and 220 and the dies 210 and 224 are assembled together as described above. The holes through the layers are filled with a conductive material.

Additional understanding of the structure of the pressure sensing element 200 depicted in FIG. 2 can be had by other figures that depict the various layers shown in cross-section in FIG. 2.

Figure 4A:
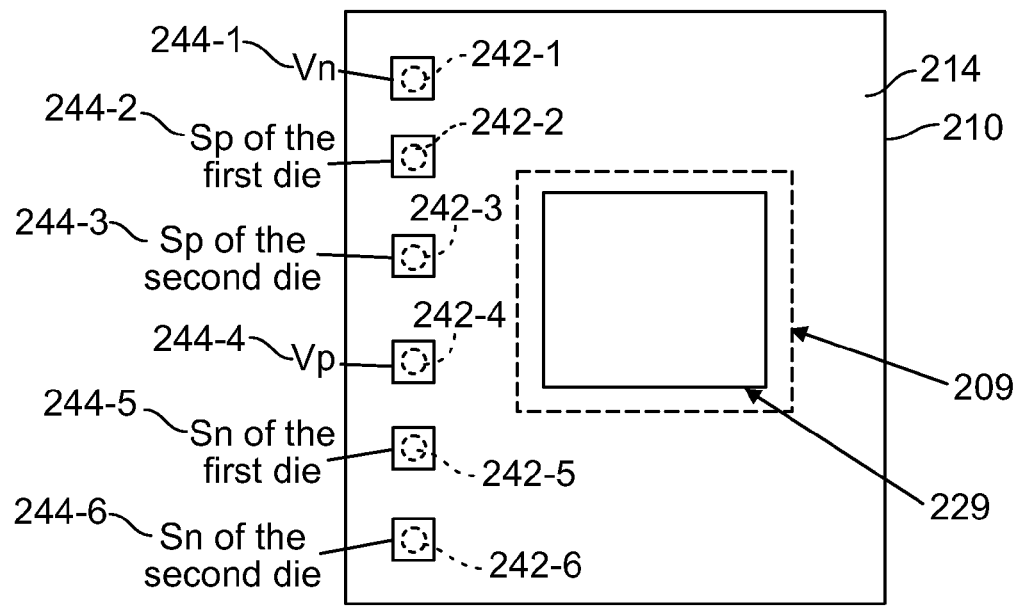
FIG. 4A is a view of the second side of the first silicon die and shows bond pads to which electrical connections are made.

FIG. 4A is a top view of the pressure sensing element 200 looking "downwardly" at the second side 214 of the first silicon die 210. The second side 214 of the first silicon die 210 faces away from the spacer 202.

Six square or rectangular bond pads 244 are identified by reference numerals 244-1 to 244-6. The bond pads 244-1 to 244-6 are effectively on top of an in electrical connection with conductive vias 242 that extend downwardly, i.e., into the plane of FIG. 4A through the layers of the die 210 described above. The bond pads 244-4 and 244-1 are electrical contacts for the $V_p$ and $V_n$ power supply voltages that are provided to both Wheatstone bridge circuits 216 and 234. Bond pads 244-2 and 244-5 are electrical contacts for the output nodes $S_p$ and $S_n$ for the top or first Wheatstone bridge circuit 216, the electrical schematic of which is shown in FIG. 3 and identified by reference numeral 300. Bond pads 244-3 and 244-6 are electrical contacts for the output nodes $S_p$ and $S_n$ for the bottom or second Wheatstone bridge circuit 234, the electrical schematic of which is shown in FIG. 3 and identified by reference numeral 302. The above layout is only to demonstrate one of functional designs. The layout of bond pads, conductive interconnects, and vias can be designed in many other different ways.

In FIG. 4A, reference numeral 209 points to a square drawn using a broken line. The square 209 depicts the "footprint" of the evacuated top recess 208 in the spacer 202 that lies below the die 210. The square 229 shows the cavity on the second side 214 of the first silicon die 210.

Figure 4B:
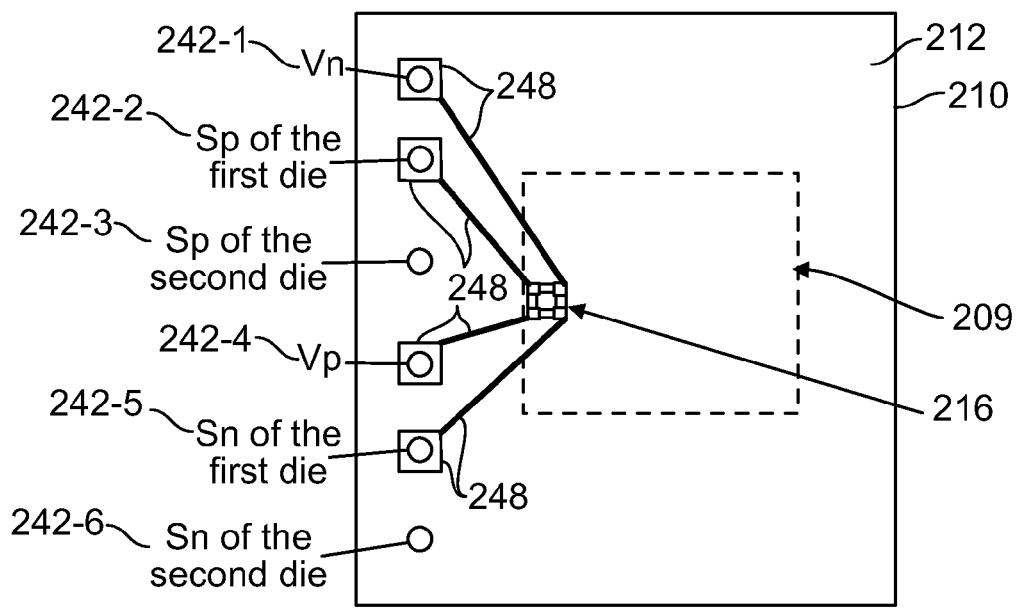
FIG. 4B shows the first side of a first silicon die and connections to a first Wheatstone bridge circuit thereon.

FIG. 4B is the first side 212 of the first silicon die 210. Stated another way, FIG. 4B and FIG. 4A are opposite sides of the first silicon die 210.

In FIG. 4B, the first Wheatstone bridge circuit 216 is comprised of four P-resistors electrically connected to each other as shown in the first Wheatstone bridge circuit 300 in FIG. 3. Reference numeral 209 identifies the aforementioned footprint of the recess 208 in the first side 204 of the spacer 202, and which is covered by the first silicon die 210.

As shown in FIG. 3, the Wheatstone bridge circuits have input nodes denominated as $V_p$ and $V_n$. The output nodes of the bridge circuits are denominated as $S_p$ and $S_n$. In FIG. 4B, the positive and negative supply voltages, $V_p$ and $V_n$ for the bridge circuit 216 are available at the left-hand side of the die 210 because of the aforementioned conductive vias 242 that extend through the die 210. In FIG. 4B, the two conductive vias identified for consistency purposes by reference numerals 242-4 and 242-1 are connected to the $V_p$ and $V_n$ input nodes of the Wheatstone bridge 216 via conductive traces 248 formed from P+ conductive silicon interconnects deposited onto the first surface 212 of the first die 210. In the figure, the output nodes $S_p$ and $S_n$ of the first Wheatstone bridge 216 are connected to two other conductive vias, which for consistency purposes are identified in the figure by reference numerals 242-2 and 242-5.

In FIG. 4B, reference numerals 242-3 and 242-6 "point" to two circles, which are top views of two conductive vias that extend through the first die 210 but which extend electrical connections downwardly to lower layers of the pressure sensing element 200. The vias 242-3 and 242-6 carry signals from the Sp and Sn output nodes of the "bottom" or second Wheatstone bridge circuit 234, which is located in the second die 224.

Figure 4C:
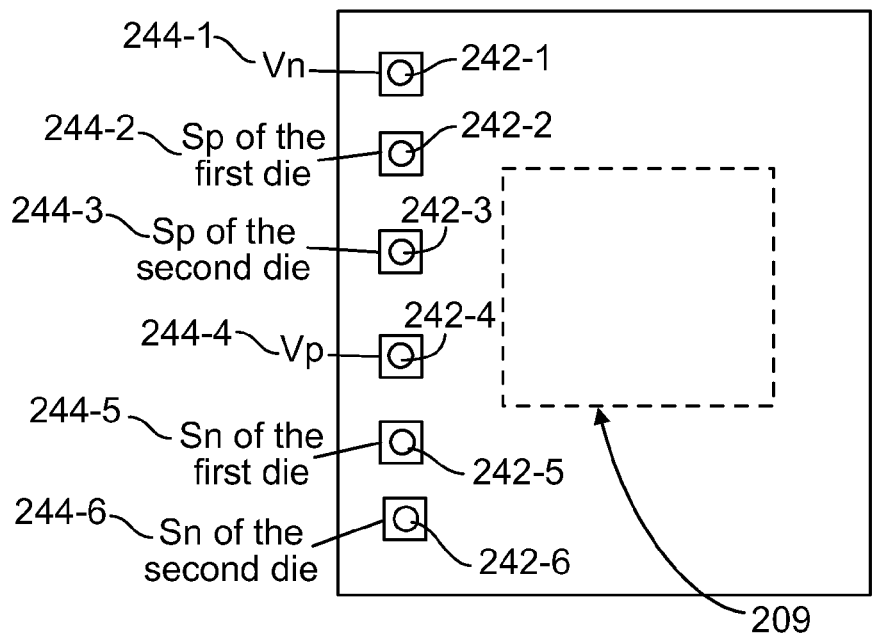
FIG. 4C shows the bond pad on the oxide layer between the first silicon die and the spacer.

FIG. 4C is the first silicon oxide spacer or layer 219, which is located between the first silicon die 210 and the spacer 202.

The oxide layer 219 provides a silicon-to-silicon bond between those two structures. Six squares or rectangles located at the left-hand side of FIG. 4C are metal bond pads that are identified by reference numerals 244-1 to 244-6 for consistency purposes because the six metal bond pad squares carry respectively, the electrical signals $V_n$, $S_p$ for the first die, Sp for the second die, $V_p$ and $S_n$ for the first die and $S_n$ for the second die. Reference numerals 242-1 through 242-6 identify portions of the bond pad2 that extend through the oxide layer 219 and which align with vias that extend through the spacer 202. Reference numeral 209 identifies the footprint or outline of the recess 208, which the oxide layer 219 is overlaid.

Figure 4D:
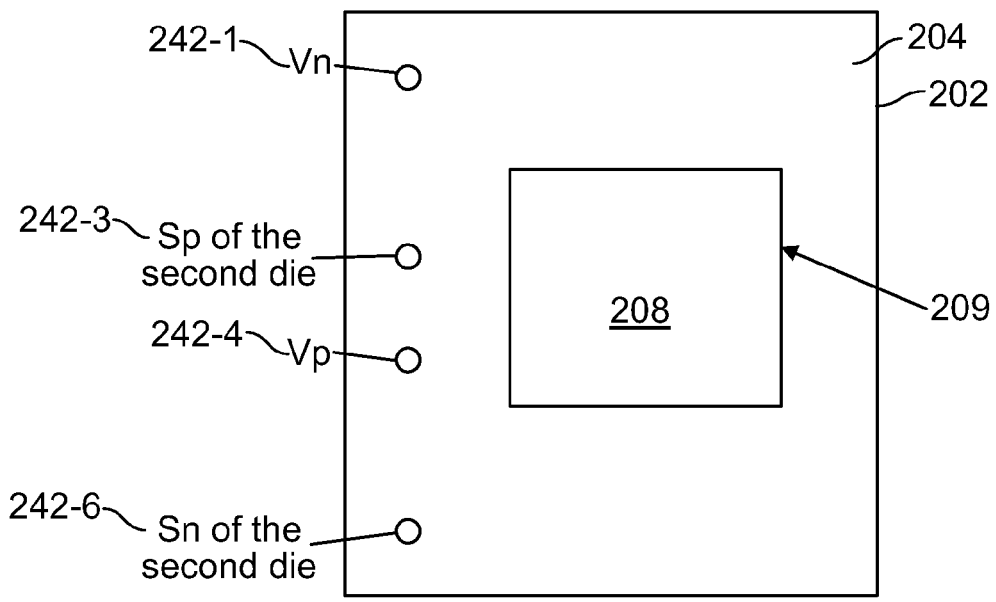
FIG. 4D shows the vias through the spacer.

FIG. 4D is a top or first side 204 of the spacer 202. Four conductive vias 242-1, 242-3, 242-4, and 242-6 extend through the spacer 202 downwardly, i.e., into the plane of FIG. 4D, and are represented by four circles at the left-hand side of the figure. As shown in FIG. 2, which is a cross section of the pressure sensing element 200, the vias 242 extend "vertically" through the spacer 202 down to the second die 224, which is attached to the lower or second side 206 of the spacer 202, which is where the lower or second Wheatstone bridge circuit 234 is located in the pressure sensing element 200. In FIG. 4D, reference numeral 209 represents the outer edges of the recess 208. The vias 242-1, 242-3, 242-4, and 242-6 carry signals through the spacer, 202 to and from the second Wheatstone bridge circuit 234 on the second silicon die 224.

Figure 4E:
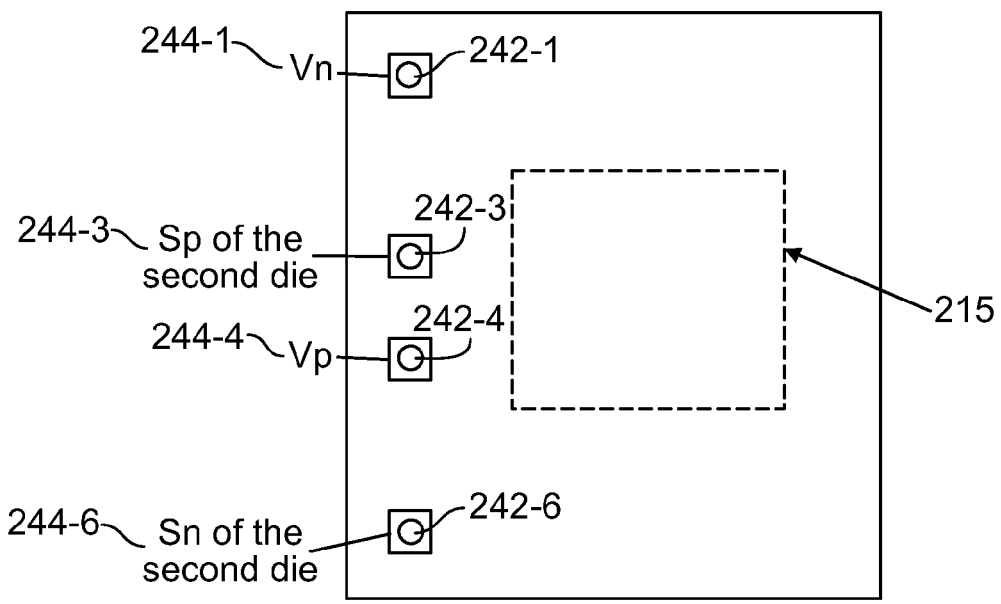
FIG. 4E shows the bond pads on the oxide layer between the spacer and the second silicon die.

FIG. 4E is the lower or second silicon oxide layer 220. As shown in FIG. 2, it is located between the bottom of the second side 206 of the spacer 202 and the top or first side 226 of the second silicon die 224. Reference numeral 215 identifies the footprint of the lower recess 218 formed into the second side 206 of the spacer 202 and around which the oxide layer 220 is attached.

In FIG. 4E, the four small squares on the left-hand side of the figure identified by reference numerals 244-1, 244-3, 244-4 and 244-6 identify electrically conductive metal bond pads surrounding conductive vias 242-1, 242-3, 242-4 and 242-6 that carry signals $V_n$, $S_p$ for the second Wheatstone bridge 234, $V_p$ and $S_n$ of the second Wheatstone bridge 234, respectively.

Figure 4F:
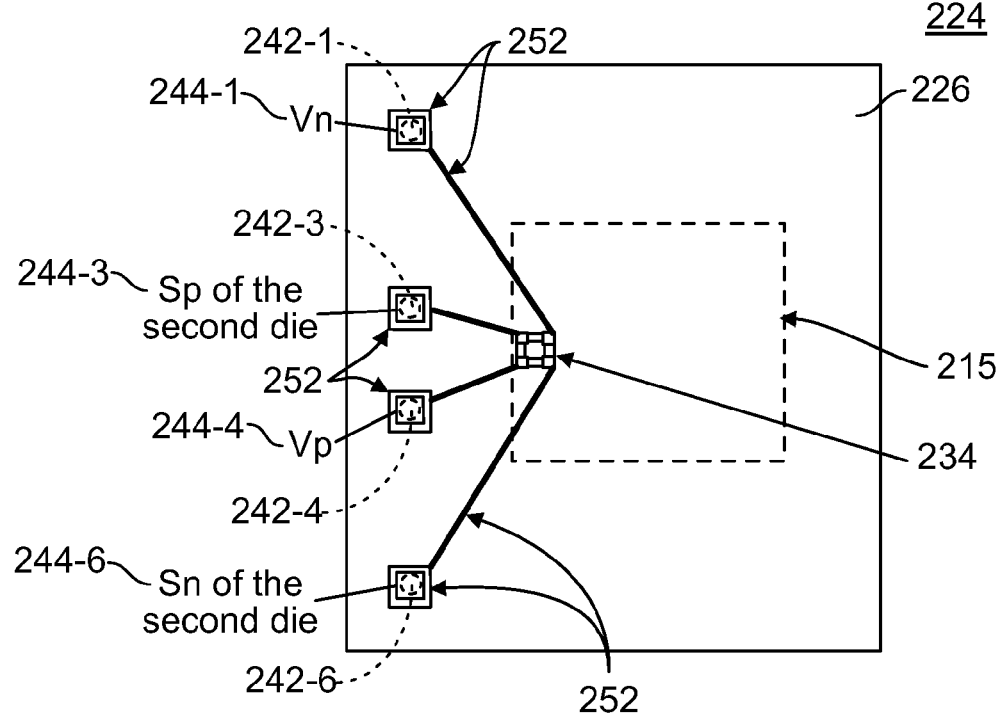
FIG. 4F shows the first side of a second silicon die and connections to a second Wheatstone bridge circuit thereon.

FIG. 4F depicts the circuitry on the second silicon die 224. Reference numeral 215 identifies the footprint of the second recess 218 that is formed into the second side 206 of the spacer 202. The piezoresistors that comprise the second Wheatstone bridge circuit 234 are electrically connected by P+ interconnects 252 to four P+ squares 252, which surround bond pads identified by reference numerals 244-1, 244-3, 244-4 and 244-6. The P+ conductive squares 244-1, 244-3, 244-4 and 244-6 are electrically connected to the vias for $V_n$, $S_p$ for the second Wheatstone bridge 234, $V_p$ and $S_n$ for the second Wheatstone bridge 234, respectively Those vias are identified by reference numerals 242-1, 242-3, 242-4 and 242-6.

Figure 5:
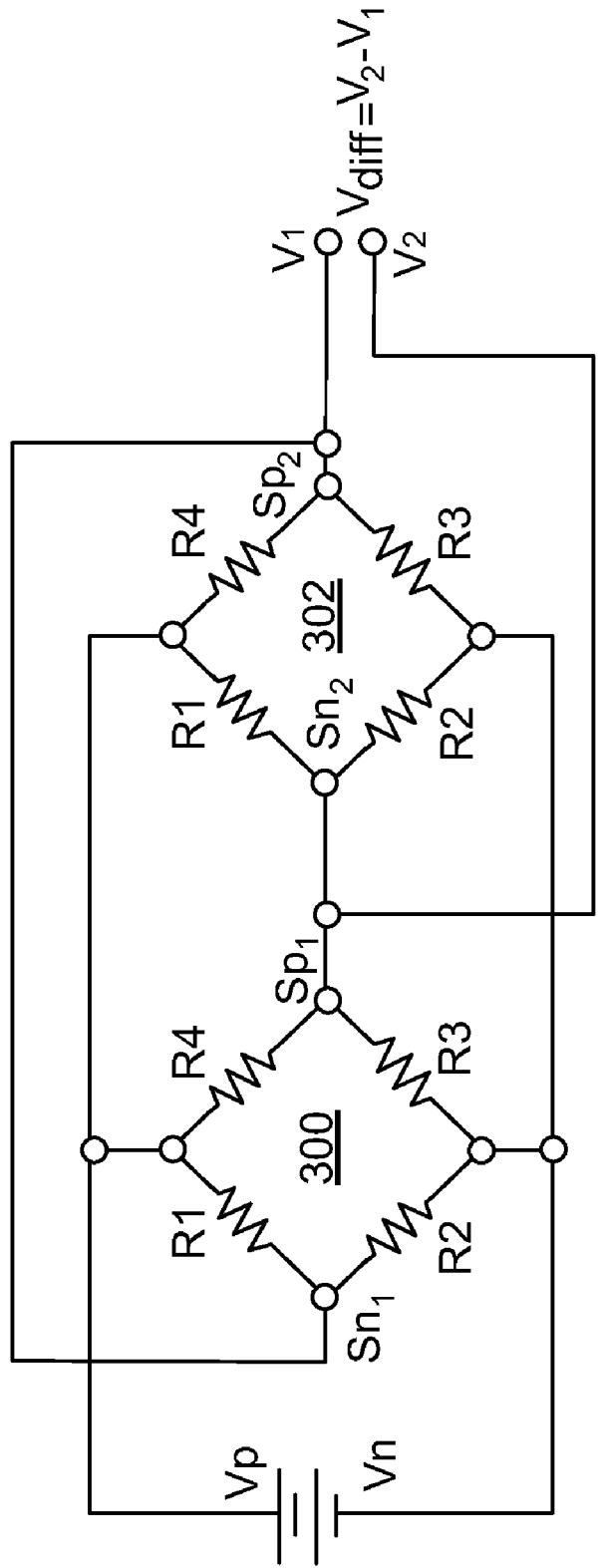
FIG. 5 shows how two Wheatstone bridge circuits are connected in a second embodiment.

FIGS. 4A-4F depict the layers of a first embodiment of a differential pressure sensor shown in the cross-section in FIG. 2. Six bond pads 244-1 through 244-6 on the top or second side 214 of the first silicon die 210 are required to electrically connect the Wheatstone bridge circuits. Two of the six bond pads are required to connect a power supply to each of the two input nodes $V_p$ and $V_n$ of the two Wheatstone bridge circuits. The other four bond pads are required for electrical connections to the $S_p$ and $S_n$ output nodes of the Wheatstone bridge circuits. In an alternate embodiment, the number of bond pads is reduced from six to four by interconnecting two nodes of the two Wheatstone bridge circuits within the sensor element layers. FIG. 5 is a schematic diagram of the interconnection of two Wheatstone bridge circuits by which the two different output voltages of the two circuits can be determined directly from the circuits themselves. Stated another way, in FIG. 5, the output voltage $V_{diff}$ which requires only two bond pads, is the algebraic difference between the output voltage of the first Wheatstone bridge 300 and the second Wheatstone bridge circuit 302.

Figure 6A:
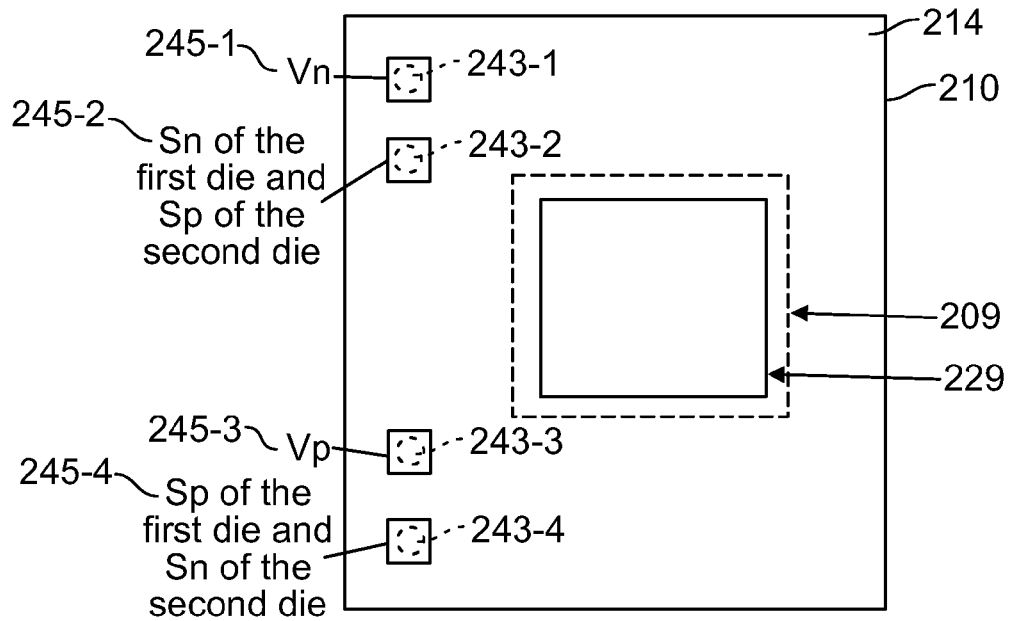
FIG. 6A is a view of the second side of the first silicon die and shows bond pads to which electrical connections are made.

FIG. 6A is a view of the second side 214 of the first silicon die 210 used in the aforementioned alternate embodiment of the pressure sensing element 200. Four bond pads 245-1, 245-2, 245-3 and 245-4 are electrically connected to conductive vias, which are identified in FIGS. 6A and 6B by reference numerals 243-1 to 243-4. The conductive vias 243-1 to 243-4 extend downwardly from the bond pads 245-1, 245-2, 245-3 and 245-4, into the plane of the figure. The conductive vias provide electrical connections to Wheatstone bridge circuits in the two dies. By cross connecting Sp and Sn of the two Wheatstone bridge circuits 216 and 234 as shown in FIG. 5, only four bond pads, i.e., bond pads 245-1 through 245-4, and four vias 243-1 through 243-4 are required to provide all of the connections between the Wheatstone bridge circuits and external circuits that are necessary to measure changes in the values of the piezoresistors.

In FIG. 5, the $V_1$ output node is electrically connected to the $S_n$ node of the first Wheatstone bridge circuit 300 and to the $S_p$ node of the second Wheatstone bridge circuit 302. In FIG. 6A, reference numeral 245-2 identifies a bond pad that is labeled as both $S_n$ of the first die and $S_p$ of the second die.

Figure 6B:
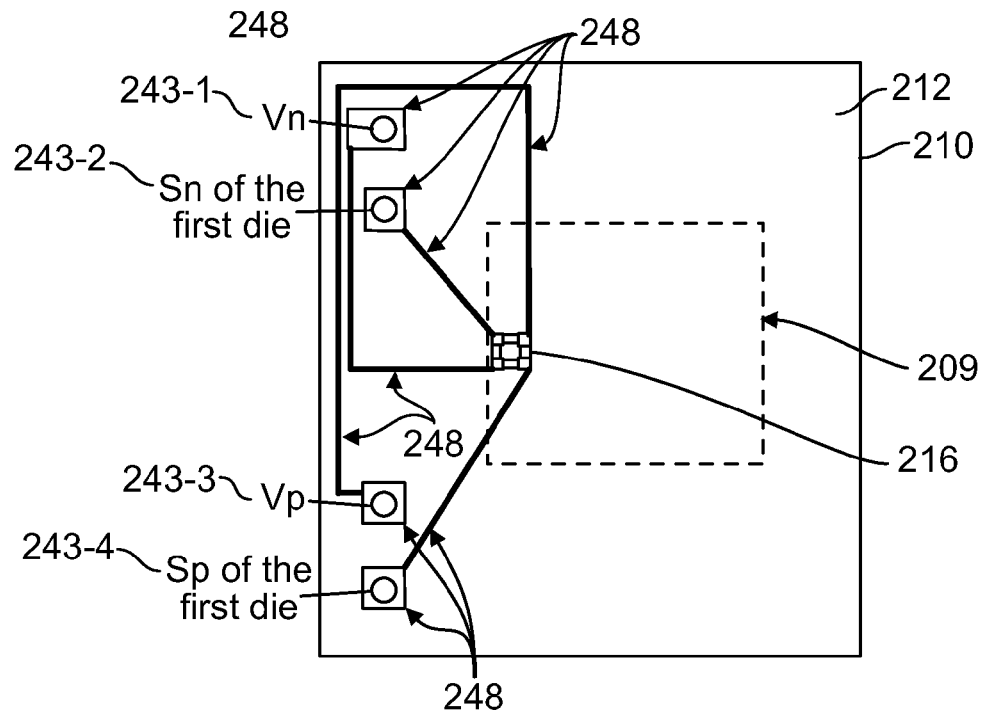
FIG. 6B shows the first side of a first silicon die and connections to a first Wheatstone bridge circuit thereon.

In FIG. 5, the $V_2$ output node is electrically connected to the Sp node of the first Wheatstone bridge circuit 300 and to the $S_n$ node of the second Wheatstone bridge circuit 302. In FIG. 6A, reference numeral 245-4 identifies a bond pad connected to $S_p$ of the first silicon die 210 and $S_n$ of the second silicon die 224. As shown in FIG. 6B, P+ interconnects 248 formed on the first side 212 of the first silicon die 210 provide the necessary electrical connections between the $S_p$ and $S_n$ nodes of the two circuits to reduce the number of bond pads from six to four.

FIG. 6B depicts the layout of P+ interconnects 248 on the first side 212 of the first die 210. Reference numeral 209 identifies the foot print of the recess 208 formed into the first side 204 of the spacer 202. The recess 208 lies below the die 210. Reference numerals 243-1, 243-2, 243-3 and 243-4 identify conductive vias through the die 210. The P+ interconnects 248 electrically connect the vias to the piezoresistors of the first Wheatstone bridge 216.

Figure 6C:
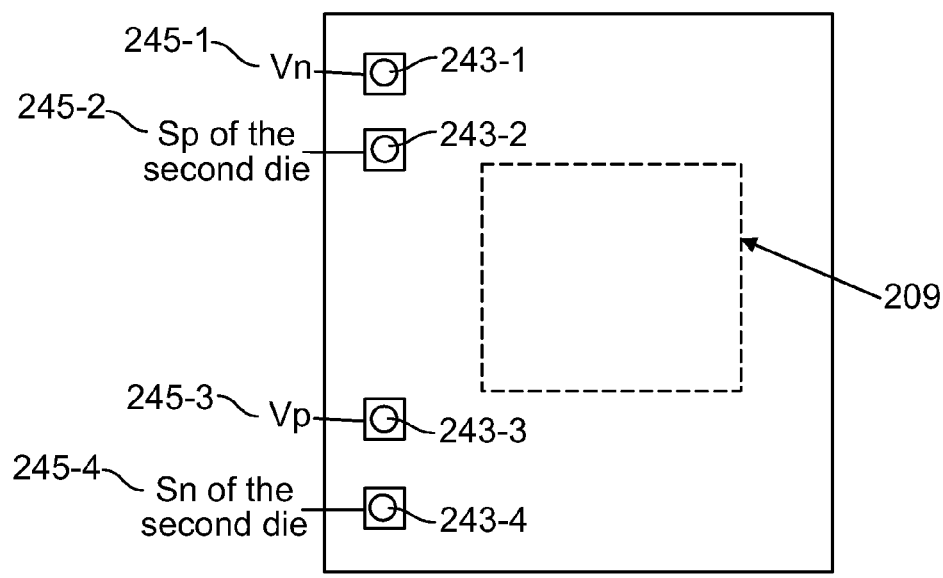
FIG. 6C shows the bond pad on the oxide layer between the first silicon die and the spacer.
Figure 6D:
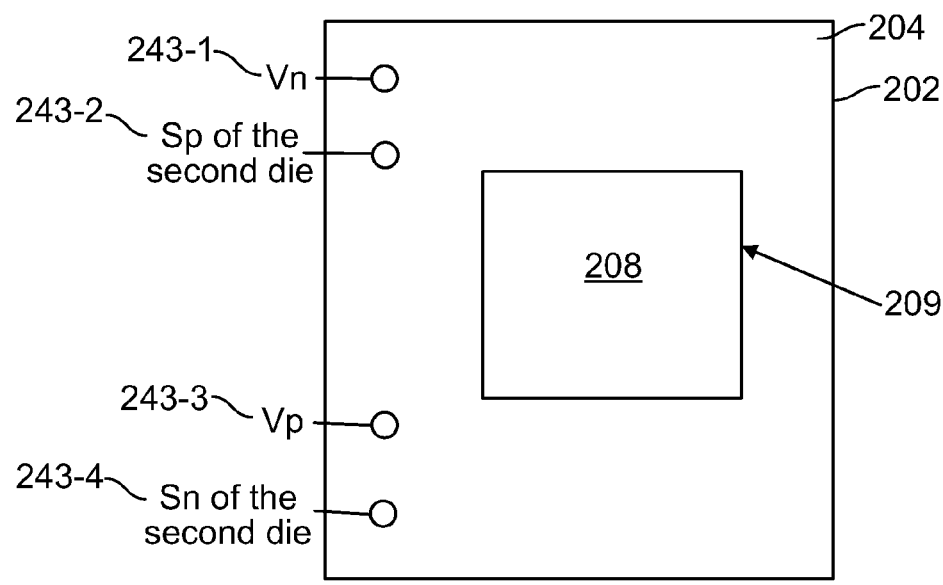
FIG. 6D shows the vias through the spacer.

FIG. 6C depicts the layout of the first oxide layer 219 used in the second embodiment of the pressure sensing element 200. The first oxide layer 219 is located between the first surface 204 of the spacer 202 and the first side 212 of the first silicon die 210. Reference numerals 245-1 to 245-4 identify four rectangular metal bond pads that make electrical contact with conductive vias 243-1 to 243-4 that extend through the spacer 202 and which make electrical contact with the vias that extend through the first silicon die 210. FIG. 6D shows the first side 204 of the spacer 202 that is used with the alternate embodiment of the pressure sensing element 200. Four conductive vias on the left-hand side of the figure are labeled 243-1 to 243-4. The first conductive via 243-1 carries the $V_n$ supply voltage for both Wheatstone bridge circuits. The second conductive via 243-2 is connected to the $S_n$ output node of the first die as well as the $S_p$ output node of the second die. The third conductive via 243-3 is connected to the $V_p$ input voltage for both Wheatstone bridge circuits. The fourth conductive via 243-4 carries the and $S_p$ output node of the first silicon die and the $S_n$ output node of the second silicon die.

Reference numeral 209 identifies the edges of the recess 208 formed into the first side 204 of the spacer 202.

Figure 6E:
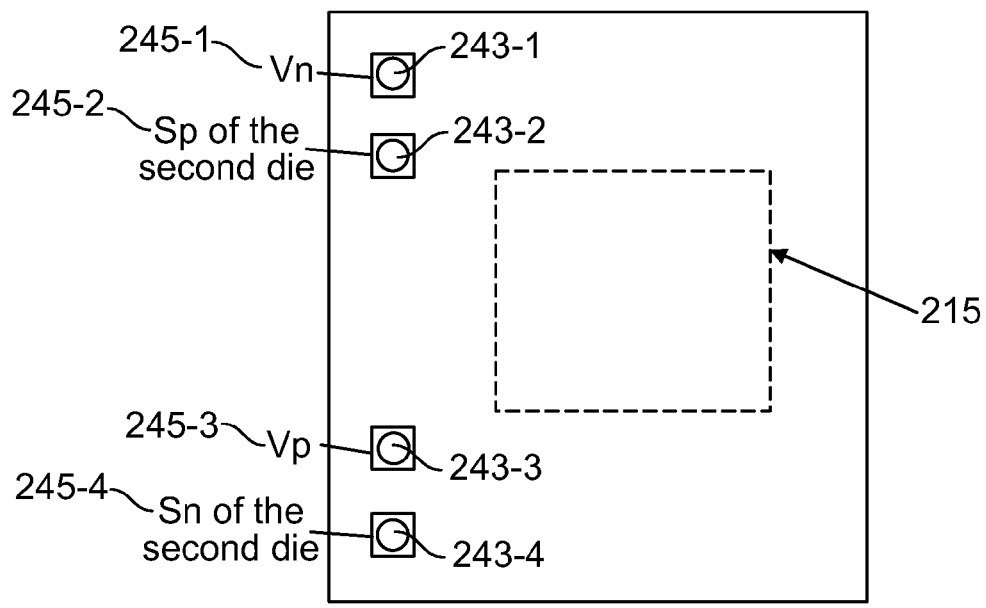
FIG. 6E shows the bond pads on the oxide layer between the spacer and the second silicon die.

FIG. 6E shows the layout of the second or lower oxide layer 220, which is located between the second side 206 of the spacer 202 and the bottom or second die 224. In FIG. 6E, reference numeral 215 shows where the lower recess 218 is formed in the second side 206 of the spacer 202 is located.

Figure 6F:
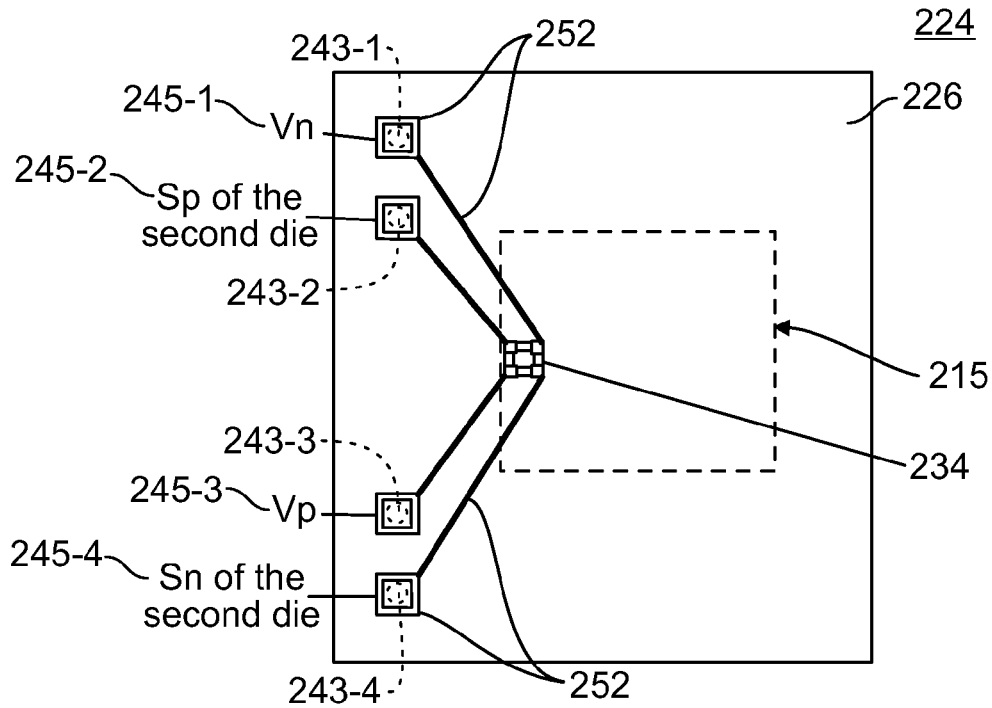
FIG. 6F shows the first side of a second silicon die and connections to a second Wheatstone bridge circuit thereon.

Finally, FIG. 6F shows the layout of the top or first side 226 of the second silicon die 224. P+ interconnects 252 connect the metal bond pads $V_p$ 245-3 and $V_n$ 245-1 to the piezoresistors of the second Wheatstone bridge 234 as shown. Other P+ interconnects 252 connect the output nodes of the Wheatstone bridge circuit 234 to bond pads 245-2 and 245-4 surrounding and making electrical contact with conductive vias 243-2 and 243-4. Reference numeral 215 identifies the location of the sidewalls of the recess 218 formed into the second side 206 of the spacer 202.

A comparison of FIGS. 6B and 6E shows that $S_p$ node of the Wheatstone bridge circuit 216 on the first die 210 is electrically connected to the $S_n$ node of the Wheatstone bridge circuit 234 on the second die 224. Similarly, the $S_n$ node of the Wheatstone bridge circuit 216 on the first die 210 is electrically connected to the $S_p$ node of the Wheatstone bridge circuit 234 on the second die 224. By cross-connecting the $S_p$ and $S_n$ nodes of the two Wheatstone bridge circuits within the sensor structure, the number of bond pads required to make connections to the sensor can be reduced from six to four.

Figure 7:
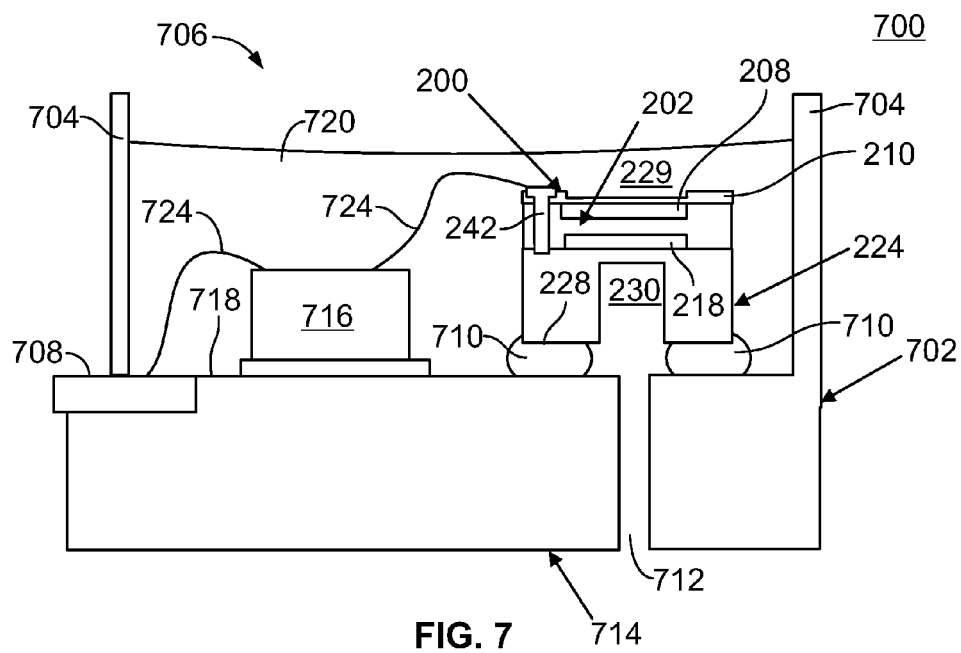
FIG. 7 is a cross-sectional view of a portion of a pressure sensor.

FIG. 7 is a cross-sectional view of a portion 700 of a pressure sensor. The portion 700 is comprised of a pressure sensing element 200 as described above, mounted in a plastic housing 702. The housing 702 is comprised of a side wall 704 that surrounds a pocket 706, which is optionally filled with a protective gel 720. The floor or bottom 718 of the pocket 706 supports the pressure sensing element 200 on small dollops 710 of adhesive that provide a seal around the opening 230 in the bottom 228 of the second die 224 and the pressure port 712. A pressure port 712 is formed through the base 714 of the housing 702, which permits liquid or gaseous fluids to apply pressure to the second silicon die 224.

An application-specific integrated circuit (ASIC) 716 is adhesively bonded to the floor or bottom 718 of the pocket 706. The gel, 720, if used, protects both the pressure sensing element 200 and bond wires 724 that extend from the bond pads 244 of the pressure sensing element to the bond pads (not shown) of the ASIC 716. Bond wires also connect the ASIC 716 to leadframes 708.

Figure 8:
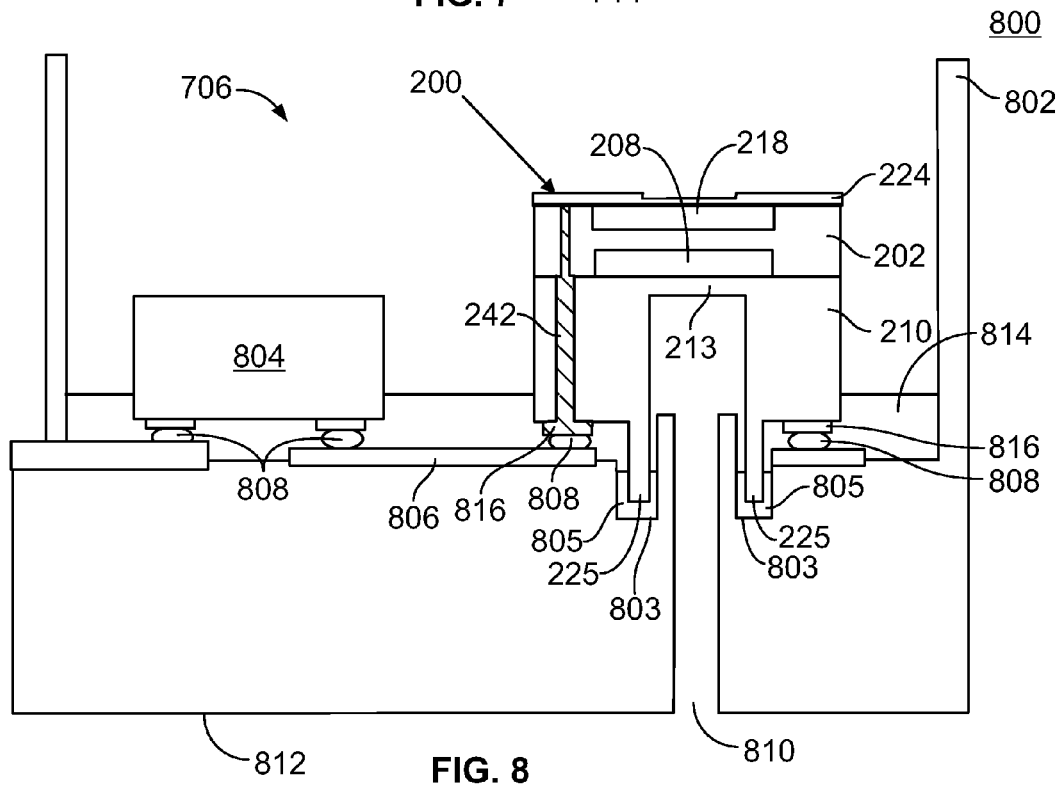
FIG. 8 is a cross-sectional view of an alternate embodiment of a portion of a pressure sensor.

FIG. 8 is a cross-sectional view of an alternate embodiment of a portion 800 of a pressure sensor, which uses "flip-chip" assembly techniques. A pressure sensing element 200 as described above sits within a housing 802 having an application-specific integrated circuit (ASIC) 804, which provides signals to, and reads signals from the pressure sensing element 200. The pressure sensing element 200 is flip-chipped or upside down with a thicker substrate in the first silicon die 210 and a thinner substrate in the second silicon die 224. The first die 210 is formed to have a channel or tube protrusion 225 that extends downwardly from the second side of the first silicon die 210 and which fits inside a square or an annular groove 803 formed into the bottom of the housing 802. The groove 803 is partially filled with an adhesive 805, which holds the protrusion 225 in the groove 803.

Conductive lead frames 806 extend between ball grid arrays (BGA) or electrically conductive adhesive (ECA) 808 that attach both the ASIC 804 and the pressure sensing element 200 to the lead frames 806. Bond pads 816 located at the "bottom" of the pressure sensing element 200 are electrically connected to the lead frames 806 using a BGA or ECA 808.

Conductive vias 242 described above carry signals to the bond pads 816 and BGA or ECA 808 from various layers of the pressure sensing element 200. A lower pressure port 810 extends through the base 812 of the housing 802 to allow liquids or fluids to exert pressure on the diaphragm 213 formed in the first silicon die 210.

One advantage of the pressure sensor depicted in FIG. 8 over the pressure sensor depicted in FIG. 7 is that in FIG. 8, gel is not overlaid the pressure sensing element 200. Another advantage is that wire bonding is not used. An optional under fill 814 surrounds the connections provided by the BGA or ECA 808. The under fill 814, is used, acts as an encapsulant that reduces oxidation of the connections between the BGA 808 and the lead frames 806 and also helps to hold the pressure sensing element 200 and ASIC 804 during vibration or drop.

The foregoing description is for purposes of illustration only. The true scope of the invention is defined by the appurtenant claims.

What is claimed is:

1. A pressure sensing element, comprising:
    a spacer having first and second sides, the first side including a first recess, the second side including a second recess, the spacer further having a first insulated conductive via residing outside of the recesses;
    a first silicon die attached to the first side of the spacer and covering the first recess, the first silicon die having first and second sides, the first side of the first silicon die including a circuit, electrical interconnects, a second insulated conductive via coupled to the first insulated conductive via and a first silicon diaphragm; and
    a second silicon die attached to the second side of the spacer and covering the second recess, the second silicon die having first and second sides, the first side of the second silicon die including a circuit, electrical interconnects and a second silicon diaphragm.

2. The pressure sensing element of claim 1, wherein the recesses are at least partially evacuated.

3. The pressure sensing element of claim 1, wherein the spacer is silicon, and wherein the spacer is fusion bonded to the first and second dies.

4. The pressure sensing element of claim 1, wherein the spacer is glass that is anodically bonded to the first and second silicon dies.

5. The pressure sensing element of claim 1, further comprising a first bonding layer attaching the first side of the first silicon die to the first side of the spacer.

6. The pressure sensing element of claim 1, further comprising a second bonding layer attaching the first side of the second silicon die to the second side of the spacer.

7. The pressure sensing element of claim 3, wherein the first bonding layer is silicon oxide.

8. The pressure sensing element of claim 5, wherein the second bonding layer is silicon oxide.

9. The pressure sensing element of claim 8, wherein the second bonding layer is a dielectric layer and configured to have a metal bond pad connecting a first end of the conductive via by a metal interconnect through a contact window in the dielectric layer.

10. The pressure sensing element of claim 1, wherein the conductive via has a first end and second end and the conductive via is comprised of at least one of:
    metal;
    doped silicon.

11. The pressure sensing element of claim 1, wherein the first and second circuits are piezoresistive Wheatstone bridge circuits.

12. The pressure sensing element of claim 11, wherein the Wheatstone bridge circuits are comprised of four nodes, the first and second nodes of the first circuit are coupled to corresponding first and second nodes of the second circuit, the third node of the first circuit is coupled to the fourth node of the second circuit at a first output node, and the fourth node of the first circuit is coupled to the third node of the second circuit at a second output node, and wherein the algebraic difference of signal levels at the first and second output nodes is representative of a pressure difference between the first and second diaphragms.

13. A pressure sensor comprised of:
    a housing having a differential pressure sensing element and an integrated circuit (IC) coupled to the differential pressure sensor, the differential pressure sensing element being comprised of:
        a spacer having first and second sides, the first side including a first recess, the second side including a second recess, the spacer further having a first insulated conductive via residing outside of the recesses;
        a first silicon die attached to the first side of the spacer and covering the first recess, the first silicon die having first and second sides, the first side of the first silicon die including a circuit, electrical interconnects, a second insulated conductive via coupled to the first insulated conductive via and a first silicon diaphragm; and
        a second silicon die attached to the second side of the spacer and covering the second recess, the second silicon die having first and second sides, the first side of the second silicon die including a circuit, electrical interconnects and a second silicon diaphragm.

14. The differential pressure sensor of claim 13, further comprising a gel covering the differential pressure sensor and the IC.

15. The differential pressure sensor of claim 13, further comprising a plurality of bond wires, configured to connect the differential pressure sensor to the IC and connect the IC to the conductive leadframes, the plurality of bond wires being embedded in the gel.

16. The differential pressure sensor of claim 13, wherein the housing has at least one port, coupled to one of the first and second diaphragms.

17. The differential pressure sensor of claim 13, wherein the housing has a plurality of conductive leadframes configured to carry electrical signals between the differential pressure sensing element and the IC, and wherein the conductive leadframes are coupled to the differential pressure sensing element and the IC by ball grid arrays (BGA).

18. The differential pressure sensor of claim 13, wherein the housing has a plurality of conductive leadframes configured to carry electrical signals between the differential pressure sensing element and the IC, and wherein the conductive leadframes are coupled to the differential pressure sensing element and the IC by an electrically conductive adhesive (ECA).

19. The differential pressure sensor of claim 17, further comprising an underfill, substantially covering the BGAs.

20. The pressure sensing element of claim 13, wherein the first and second circuits are piezoresistive Wheatstone bridge circuits, comprised of four nodes, the first and second nodes of the first circuit are coupled to corresponding first and second nodes of the second circuit, the third node of the first circuit is coupled to the fourth node of the second circuit at a first output node, and the fourth node of the first circuit is coupled to the third node of the second circuit at a second output node, and wherein the algebraic difference of signal levels at the first and second output nodes is representative of a pressure difference between the first and second diaphragms.

21. The pressure sensing element of claim 11, wherein the piezoresistive Wheatstone bridge circuits are comprised of four nodes, the first and second nodes of the first bridge circuit are coupled to a first input voltage, the third node and fourth nodes of the first bridge circuit define a first absolute pressure output voltage, the first and second nodes of the second bridge circuit are coupled to a second input voltage, the third and fourth nodes of the second bridge circuit define a second absolute pressure output voltage, the difference between the first absolute pressure output voltage and the second absolute pressure output voltage being a voltage representative of the differential pressure between the first and second diaphragms.

22. The pressure sensing element of claim 13, wherein the first and second circuits are piezoresistive Wheatstone bridge circuits comprised of four nodes, the first and second nodes of the first bridge circuit are coupled to a first input voltage, the third node and fourth nodes of the first bridge circuit define a first absolute pressure output voltage, the first and second nodes of the second bridge circuit are coupled to a second input voltage, the third and fourth nodes of the second bridge circuit define a second absolute pressure output voltage, the difference between the first absolute pressure output voltage and the second absolute pressure output voltage being a voltage representative of the differential pressure between the first and second diaphragms.

* * * * *